United States Patent
Tsukao et al.

(10) Patent No.: US 10,269,467 B2
(45) Date of Patent: Apr. 23, 2019

(54) ANISOTROPIC CONDUCTIVE FILM AND CONNECTION STRUCTURE

(71) Applicant: DEXERIALS CORPORATION, Tokyo (JP)

(72) Inventors: Reiji Tsukao, Utsunomiya (JP); Takeshi Miyake, Oyama (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/741,135

(22) PCT Filed: Jul. 11, 2016

(86) PCT No.: PCT/JP2016/070391
§ 371 (c)(1),
(2) Date: Dec. 29, 2017

(87) PCT Pub. No.: WO2017/010446
PCT Pub. Date: Jan. 19, 2017

(65) Prior Publication Data
US 2018/0197657 A1    Jul. 12, 2018

(30) Foreign Application Priority Data
Jul. 13, 2015   (JP) .................................. 2015-139491

(51) Int. Cl.
*H01B 5/16* (2006.01)
*C09J 7/29* (2018.01)
(Continued)

(52) U.S. Cl.
CPC ................. *H01B 5/16* (2013.01); *B32B 7/12* (2013.01); *C09J 7/29* (2018.01); *C09J 7/30* (2018.01);
(Continued)

(58) Field of Classification Search
CPC . H01R 11/01; H01R 4/04; H05K 1/14; H05K 3/32; H05K 2201/0224; C09J 9/02
(Continued)

(56) References Cited

U.S. PATENT DOCUMENTS

| 9,418,958 B2 * | 8/2016 | Namiki | C09J 9/02 |
| 2003/0102466 A1 * | 6/2003 | Kumakura | C09J 9/02 |
| | | | 252/511 |

(Continued)

FOREIGN PATENT DOCUMENTS

| JP | 2001-160568 A | 6/2001 |
| JP | 2003-064324 A | 3/2003 |

(Continued)

OTHER PUBLICATIONS

Sep. 27, 2016 International Search Report issued in International Patent Application No. PCT/JP2016/070391.

(Continued)

*Primary Examiner* — Timothy J Thompson
*Assistant Examiner* — Michael F McAllister
(74) *Attorney, Agent, or Firm* — Oliff PLC

(57) ABSTRACT

An anisotropic conductive film is thermo-polymerizable and includes an electrically insulating base layer, an adhesive layer, an intermediate layer sandwiched therebetween, and electrically conductive particles retained by any of the layers. The intermediate layer and the adhesive layer each have a melt viscosity higher than the melt viscosity of the electrically insulating base layer. The electrically conductive particles are independent of one another when the anisotropic conductive film is viewed in plan. The modulus of elasticity of the anisotropic conductive film as a whole, at 100° C., after thermal polymerization, is higher than 1800 MPa.

11 Claims, 3 Drawing Sheets

(51) Int. Cl.
*C09J 7/30* (2018.01)
*B32B 7/12* (2006.01)
*C09J 9/02* (2006.01)
*H01R 11/01* (2006.01)
*H01L 31/0224* (2006.01)

(52) U.S. Cl.
CPC ........ *C09J 9/02* (2013.01); *H01L 31/022466* (2013.01); *H01R 11/01* (2013.01); *C08K 2201/001* (2013.01); *C09J 2201/622* (2013.01); *C09J 2203/326* (2013.01); *C09J 2205/102* (2013.01); *C09J 2205/106* (2013.01)

(58) Field of Classification Search
USPC .......................................... 174/70 R
See application file for complete search history.

(56) References Cited

U.S. PATENT DOCUMENTS

| | | | | |
|---|---|---|---|---|
| 2003/0178132 A1* | 9/2003 | Shinozaki | ............... | H01L 24/83 156/275.5 |
| 2005/0132568 A1* | 6/2005 | Asai | .................. | H01L 23/49827 29/868 |
| 2009/0090545 A1* | 4/2009 | Usui | ....................... | H01L 24/27 174/260 |
| 2010/0101700 A1* | 4/2010 | Liang | ..................... | B32B 27/16 156/73.1 |
| 2014/0159256 A1* | 6/2014 | Choi | ....................... | H01L 24/29 257/783 |
| 2016/0255724 A1* | 9/2016 | Akutsu | ..................... | C08F 2/44 361/748 |
| 2017/0012015 A1* | 1/2017 | Tsukao | ..................... | B32B 7/08 |

FOREIGN PATENT DOCUMENTS

| | | |
|---|---|---|
| JP | 2005-200521 A | 7/2005 |
| JP | 2010-024301 A | 2/2010 |
| JP | 2010-067360 A | 3/2010 |
| JP | 2010-199087 A | 9/2010 |
| JP | 2012-169263 A | 9/2012 |
| JP | 2014-044946 A | 3/2014 |

OTHER PUBLICATIONS

Sep. 27, 2016 Written Opinion issued in International Patent Application No. PCT/JP2016/070391.

Aug. 15, 2017 Written Opinion issued in International Patent Application No. PCT/JP2016/070391.

Jan. 25, 2018 International Preliminary Report on Patentability issued in Patent Application No. PCT/JP2016/070391.

Dec. 21, 2018 Office Action cited in Chinese Patent Application No. 201680037691.

* cited by examiner

ANISOTROPIC CONDUCTIVE FILM AND CONNECTION STRUCTURE

TECHNICAL FIELD

The present invention relates to an anisotropic conductive film and a connection structure.

BACKGROUND ART

Anisotropic conductive films are widely used to mount an electronic component, such as an IC chip, to a transparent substrate for a display device. From the standpoint of application to high density mounting, a double layer structured anisotropic conductive film 60, illustrated in FIG. 6, is now used to improve the efficiency of electrically conductive particle capturing and the connection reliability and to reduce the short occurrence rate. The double layer structure includes a lamination of an electrically insulating resin layer 61, which has a relatively large layer thickness, and an electrically conductive particle-containing layer 64, which has a relatively small layer thickness. The electrically conductive particle-containing layer 64 includes an electrically insulating binder 62 and electrically conductive particles 63 dispersed therein.

For such an anisotropic conductive film 60, there is a proposal that a photocurable resin composition be used as the electrically insulating binder 62 for the electrically conductive particle-containing layer 64 in order to inhibit excessive flow of the electrically conductive particles during thermocompression from the electrically insulating resin layer 61 side for anisotropically conductive connection (Patent Literature 1). In this technique, the electrically conductive particle-containing layer 64 is previously photocured in order to retain the electrically conductive particles sufficiently.

CITATION LIST

Patent Literature

Patent Literature 1: JP 2003-64324 A

SUMMARY OF INVENTION

Technical Problem

However, when anisotropically conductive connection between a substrate and an electronic component, e.g., an IC chip, is made using an anisotropic conductive film having an electrically conductive particle-containing layer in which electrically conductive particles are dispersed in a photocured electrically insulating binder, problems arise. One problem is that the electrically conductive particles form aggregates, and therefore the risk of short circuit occurrence remains. Another problem is a decrease in conduction reliability for the following reasons: electrically conductive particle capturing properties deteriorate at the edges of the bumps of an electronic component; and the electrically conductive particles cannot be pushed into the wiring or bump sufficiently. Furthermore, the photocured electrically conductive particle-containing layer has reduced adhesion, and therefore, when the anisotropic conductive film is temporarily bonded to a connection target, positional misalignment may occur.

An object of the present invention is to provide an anisotropic conductive film with which, at the time of anisotropically conductive connection, the occurrence of a short circuit is inhibited, a decrease in conduction reliability is inhibited by preventing deterioration of the electrically conductive particle capturing properties and enabling sufficient pushing of the electrically conductive particles, and good adhesion is exhibited.

Solution to Problem

The present inventors have found that the object of the invention of the present application can be achieved by the following configuration. An anisotropic conductive film includes a lamination of an electrically insulating base layer, an intermediate layer, and an adhesive layer. At least one of the adhesive layer and the intermediate layer retains the electrically conductive particles and is thermo-polymerizable. The intermediate layer and the adhesive layer each have a melt viscosity higher than the melt viscosity of the electrically insulating base layer. The electrically conductive particles are independent of one another when the anisotropic conductive film is viewed in plan. The modulus of elasticity of the anisotropic conductive film as a whole after thermal polymerization is higher than a predetermined value. With this finding, the present invention has been completed.

That is, the present invention provides an anisotropic conductive film configured as follows. The anisotropic conductive film is thermo-polymerizable and includes an electrically insulating base layer, an adhesive layer, an intermediate layer sandwiched between the electrically insulating base layer and the adhesive layer, and electrically conductive particles retained by at least one of the adhesive layer and the intermediate layer.

The intermediate layer and the adhesive layer each have a melt viscosity higher than a melt viscosity of the electrically insulating base layer.

The electrically conductive particles are independent of one another when the anisotropic conductive film is viewed in plan.

A modulus of elasticity of the anisotropic conductive film as a whole, at 100° C., after thermal polymerization, is higher than 1800 MPa.

Furthermore, the present invention provides a connection structure in which a first electronic component is anisotropically conductively connected to a second electronic component via the anisotropic conductive film described above.

Advantageous Effects of Invention

Thermo-polymerizable anisotropic conductive films according to the present invention include a lamination of an electrically insulating base layer, an intermediate layer, and an adhesive layer. Because of the adhesive layer, the properties for temporary bonding to an anisotropically conductive connection target is stabilized. At least one of the adhesive layer and the intermediate layer retains the electrically conductive particles. The melt viscosities of the intermediate layer and the adhesive layer are set to be higher than the melt viscosity of the electrically insulating base layer. With this configuration, at the time of anisotropically conductive connection, the electrically conductive particles can be pushed sufficiently without causing excessive flow of the electrically conductive particles, and as a result, good particle capturing properties and conduction reliability are ensured. Furthermore, the electrically conductive particles are independent of one another when the anisotropic conductive film is viewed in plan. With this configuration, aggregation of the electrically conductive particles in the anisotropic conductive film is prevented, and as a result, at the time of anisotropically conductive connection, the occurrence of a short circuit is prevented. Furthermore, the electrically conductive particles are independent of one another. This configuration enables uniform application of the pressing force from a tool and thus achieves uniform pushing of the electrically conductive particles. This is also due to the fact that the layer by which the electrically conductive particles are to be retained is not photocured, and therefore resistance to pushing, which can occur with a photocured resin, is reduced. Furthermore, the modulus of elasticity of the anisotropic conductive film as a whole, at 100° C., after thermal polymerization, is set to be higher than 1800 MPa. With this configuration, the pushed electrically conductive particles can be retained within a certain level after thermal polymerization.

DESCRIPTION OF EMBODIMENTS

Figure 1:
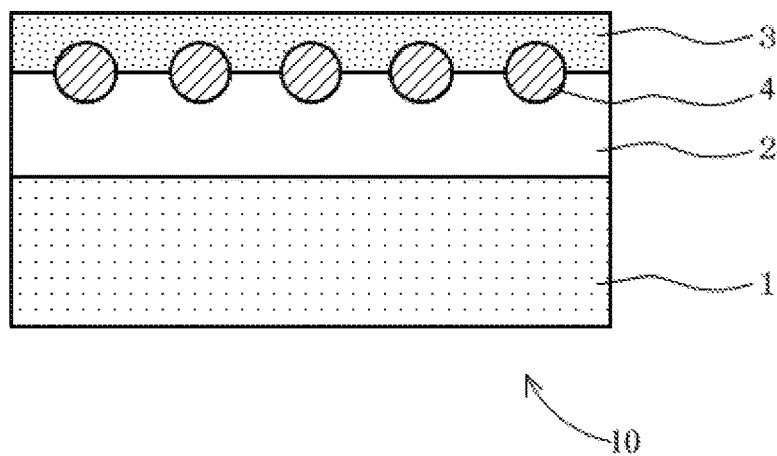
FIG. 1 is a cross-sectional view of an anisotropic conductive film of the invention of the present application.

An example of an anisotropic conductive film of the present invention will be described below in detail with reference to the drawings. Note that in the drawings, identical reference signs indicate the same or equivalent constituents.

Overall Configuration of Anisotropic Conductive Film

FIG. 1 is a cross-sectional view of an anisotropic conductive film 10 according to an example of the present invention. The anisotropic conductive film 10 includes a lamination of an electrically insulating base layer 1, an intermediate layer 2, and an adhesive layer 3. At least one of these layers is thermo-polymerizable. All the three layers are preferably thermo-polymerizable.

Figure 3:
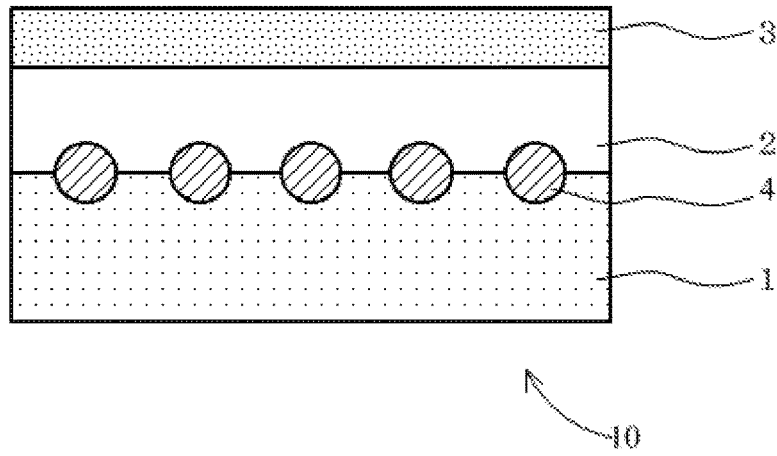
FIG. 3 is a cross-sectional view of an anisotropic conductive film of the invention of the present application.
Figure 4:
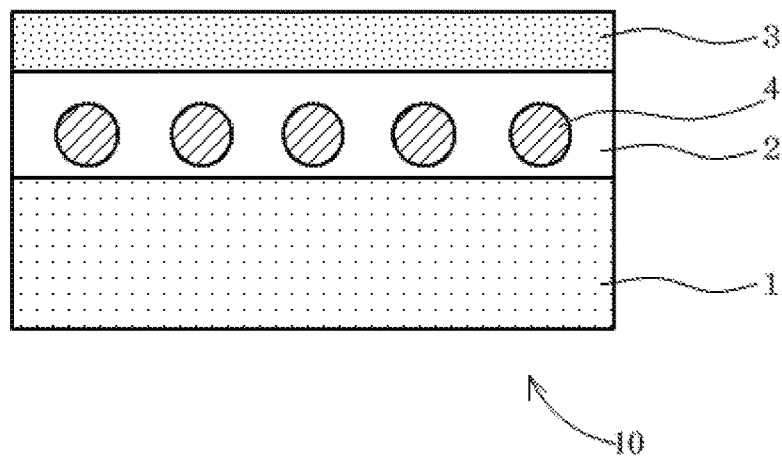
FIG. 4 is a cross-sectional view of an anisotropic conductive film of the invention of the present application.
Figure 5:
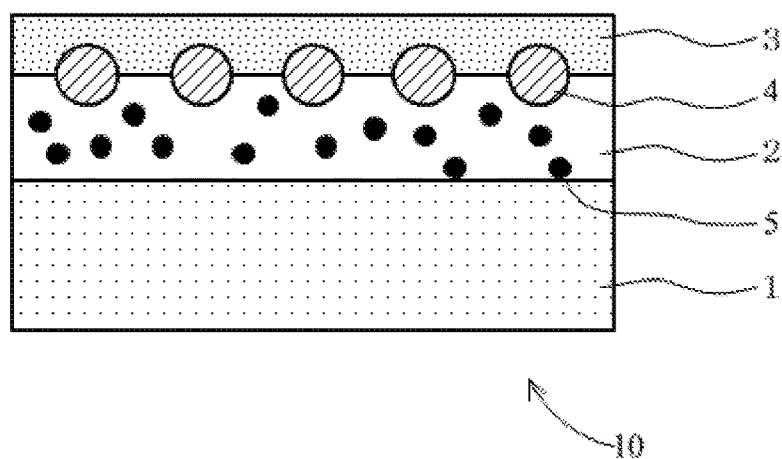
FIG. 5 is a cross-sectional view of an anisotropic conductive film of the invention of the present application.

In the embodiment of FIG. 1, the electrically conductive particles 4 are retained between the intermediate layer 2 and the adhesive layer 3. However, the electrically conductive particles 4 may be retained by any of the electrically insulating base layer 1, the intermediate layer 2, and the adhesive layer 3. For example, in the embodiment of FIG. 2, the electrically conductive particles 4 are embedded in the adhesive layer 3. In the embodiment of FIG. 3, the electrically conductive particles 4 are retained between the electrically insulating base layer 1 and the intermediate layer 2. In the embodiment of FIG. 4, the electrically conductive particles 4 are embedded in the intermediate layer 2. In the embodiment of FIG. 5, the electrically conductive particles 4 are retained between the intermediate layer 2 and the adhesive layer 3 as with the embodiment of FIG. 1, and furthermore, an electrically insulating filler 5 for adjustment of the melt viscosity is included in the intermediate layer 2. The electrically insulating filler 5 may be present in a different one of the layers. It may be included in two or more of the layers or all the three layers.

As described above, in the present invention, at least one of the electrically insulating base layer 1, the intermediate layer 2, and the adhesive layer 3 is thermo-polymerizable. In this case, the layer that retains the electrically conductive particles 4 is preferably thermo-polymerizable. The reason for this is to prevent unintentional flow of the electrically conductive particles 4. Thus, these layers are preferably layers formed from a thermo-polymerizable composition containing a thermo-polymerizable compound and a thermal polymerization initiator. The thermo-polymerizable composition may further include an electrically insulating filler for adjustment of the melt viscosity, such as silica powder or alumina powder, and other examples of materials that may be included in the composition include other fillers, softeners, promoters, antioxidants, colorants (pigments and dyes), organic solvents, and ion-trapping agents.

In the anisotropic conductive film 10 of the present invention, the melt viscosities of the intermediate layer 2 and the adhesive layer 3 are higher than the melt viscosity of the electrically insulating base layer 1. It is preferable that the melt viscosity of the adhesive layer 3 be the highest, the melt viscosity of the intermediate layer 2 be the second highest, and the melt viscosity of the electrically insulating base layer 1 be the lowest. This enables sufficient pushing of the electrically conductive particles 4 at the time of anisotropically conductive connection. The presence of the intermediate layer 2, which has a relatively high melt viscosity, facilitates both pushing of the electrically conductive particles 4 via a pressure tool and inhibition of the flow of the resin. Specifically, the melt viscosity, as measured at 80° C., of the electrically insulating base layer 1 is preferably less than or equal to 3000 mPa·s, and more preferably less than or equal to 1000 mPa·s, the melt viscosity, as measured at 80° C., of the intermediate layer 2 preferably ranges from 1000 to 20000 mPa·s, and more preferably from 3000 to 15000 mPa·s, and the melt viscosity, as measured at 80° C., of the adhesive layer 3 preferably ranges from 1000 to 20000 mPa·s, and more preferably from 3000 to 15000 mPa·s. The melt viscosity can be measured using, for example, a rotary rheometer (manufactured by TA Instruments) under the following conditions: rate of temperature increase: 10° C./min; measurement pressure: constant at 5 g; and measurement plate used: 8 mm in diameter.

Furthermore, in the anisotropic conductive film 10 of the present invention, the electrically conductive particles 4 are independent of one another when the anisotropic conductive film 10 is viewed in plan. Herein, "independent of one another" refers to a state in which the electrically conductive particles 4 are not aggregated, not in contact with one another, and also do not overlap one another in the film thickness direction. The degree of "not in contact" is such that the distance between centers of adjacent ones of the electrically conductive particles 4 is preferably from 1.5 to 50 times the average particle diameter, and more preferably from 2 to 30 times the average particle diameter. The "state of also not overlapping in the film thickness direction" refers to a state in which an electrically conductive p article does not overlap another electrically conductive particle when the anisotropic conductive film is viewed in plan.

The percentage of the "independent electrically conductive particles" relative to the total electrically conductive particles is preferably greater than or equal to 95%, more preferably greater than or equal to 96%, and still more preferably greater than 99%. The percentage can be determined by measurement from images of the fields of view of the surfaces using a metallurgical microscope or an electron microscope, for example. The measurement may be performed using a known image analyzer (e.g., WinRoof, manufactured by MITANI Corporation).

As described above, the electrically conductive particles 4 are independent of one another when the anisotropic conductive film 10 is viewed in plan. To achieve uniform light transmission through the entirety of the anisotropic conductive film 10, the electrically conductive particles 4 is preferably arranged regularly. The regular arrangement is preferably in a lattice form, examples of which include hexagonal lattice, oblique lattice, square lattice, rectangular lattice, and parallelogram lattice. The electrically conductive particles may be arranged side-by-side in linear form instead of lattice form. In such a case, the lines are preferably oblique with respect to the width direction of the film. The distance between adjacent ones of the lines is not particularly limited and either a regular or random configuration is possible. However, for practical purposes, a regular configuration is preferable.

Furthermore, the area occupancy ratio of the electrically conductive particles 4, when the anisotropic conductive film 10 is viewed in plan, is preferably less than or equal to 50%, and more preferably less than or equal to 40%, in order to inhibit the risk of the occurrence of a short circuit. To inhibit a reduction in the number of particles captured on the terminals at the time of connection and to inhibit an increase in conduction resistance, the area occupancy ratio is preferably greater than or equal to 5%, and more preferably greater than or equal to 10%.

When the electrically conductive particles are arranged regularly with the layout of the terminals taken into account, the reduction in the number of particles captured on the terminals can be minimized. Thus, it is sufficient for practical use that the area occupancy ratio be greater than or equal to 0.2%. To achieve stable connection, the area occupancy ratio is preferably greater than or equal to 5%, and more preferably greater than or equal to 10%. Herein, the "regular arrangement with the layout of the terminals taken into account" refers to a lattice form in which the electrically conductive particles are disposed in such a manner that, for example, in the longitudinal direction of a rectangular terminal (film width direction in the case of COG connection of a typical IC), external tangent lines of the electrically conductive particles are not aligned in a straight line and each external tangent line passes through some electrically conductive particles. In other words, the external tangent lines are in a meandering fashion. This configuration ensures capturing of at least a minimum number of electrically conductive particles when, for example, electrically conductive particles exist at terminal edges, where capturing is relatively difficult. In a case where the external tangent lines of the electrically conductive particles are aligned in a straight line, i.e., match one another, none of the electrically conductive particles existing at terminal edges may be captured. The above configuration is one example of disposition for avoiding the possibility. The number of the electrically conductive particles arranged regularly as described above is preferably greater than 99% of the total number of the electrically conductive particles.

The anisotropic conductive film 10 of the present invention has a modulus of elasticity, at 100° C., after thermal polymerization, of higher than 1800 MPa, or preferably higher than or equal to 2100 MPa. The reason for this is that, when the modulus of elasticity is higher than 1800 MPa, the pushed electrically conductive particles 4 can be retained sufficiently. To inhibit a reduction in toughness (flexibility) of the anisotropic conductive film 10 to thereby inhibit a reduction in adhesion between the base materials, the modulus of elasticity is preferably less than or equal to 3000 MPa, and more preferably less than or equal to 2500 MPa. Herein, the "after thermal polymerization" can be defined by the degree of conversion of the thermo-polymerizable compound. Specifically, the infrared absorption spectra of the epoxy ring or the unsaturated group of the thermo-polymerizable compound are measured using an infrared spectrophotometer (e.g., FT/IF-4100, manufactured by JASCO CORPORATION) to determine the reduction (%) in the wavelength absorption, from the amount before reaction (connection) to the amount after reaction (connection), of the epoxy rings or of the unsaturated groups. This reduction (%) is designated as the degree of conversion, and a state in which a degree of conversion of greater than or equal to 80% is reached is designated as "after thermal polymerization". The modulus of elasticity can be measured in accordance with JIS K7244-4.

The glass transition temperature of the anisotropic conductive film 10 of the present invention, after thermal polymerization, is preferably higher than 145° C., and more preferably higher than 160° C. The reason for this is that, when the glass transition temperature is higher than 145° C., the ability to retain the pushed electrically conductive particles is improved and adhesion between the base materials is easily maintained. The upper limit of the glass transition temperature need not be set as long as a significant decrease in bond strength after connection will not occur. However, from the standpoint of ease of handling, the glass transition temperature is typically lower than or equal to 220° C., and preferably lower than or equal to 168° C.

Electrically Insulating Base Layer 1

The electrically insulating base layer 1 is a layer made from a thermo-polymerizable composition containing a thermo-polymerizable compound and a thermal polymerization initiator. As necessary, a photo polymerization initiator may be included therein. Examples of the thermo-polymerizable composition include thermo-radical polymerizable acrylate-based compositions containing a (meth)acrylate compound and a thermal radical polymerization initiator and thermo-cationic polymerizable epoxy compositions containing an epoxy compound and a thermal cationic polymerization initiator.

Herein, the (meth)acrylate compound may be an existing known thermo-polymerizable (meth)acrylate monomer. Examples thereof include monofunctional (meth)acrylate-based monomers and polyfunctional, that is, two or more functional, (meth)acrylate-based monomers. In the present invention, the (meth)acrylate-based monomer is preferably at least partially a polyfunctional (meth)acrylate-based monomer such that the intermediate layer and the like can be thermally cured at the time of anisotropically conductive connection. Herein, the (meth)acrylate encompasses acrylate and methacrylate.

Examples of the thermal radical polymerization initiator may include organic peroxides and azo compounds. In particular, organic peroxides may be preferred because they do not produce nitrogen, which can induce air bubbles.

The amount of the thermal radical polymerization initiator to be used preferably ranges from 2 to 60 parts by mass, and more preferably from 5 to 40 parts by mass, per 100 parts by mass of a (meth)acrylate compound. When the amount is too small, insufficient curing will occur. When the amount is too large, the product life will decrease.

Examples of the epoxy compound may include bisphenol A type epoxy resins, bisphenol F type epoxy resins, novolak type epoxy resins, modifications of these epoxy resins, and cycloaliphatic epoxy resins. Two or more of these may be used in combination. An oxetane compound may be used in addition to the epoxy compound.

The thermal cationic polymerization initiator may be a known thermal cationic polymerization initiator for epoxy compounds. Examples of the initiator include iodonium salts, sulfonium salts, phosphonium salts, and ferrocenes, which generate acid via heat. In particular, aromatic sulfonium salts, which exhibit good temperature latency, may be preferred.

The amount of the thermal cationic polymerization initiator to be mixed preferably ranges from 2 to 60 parts by mass, and more preferably from 5 to 40 parts by mass, per 100 parts by mass of an epoxy compound. When the amount is too small, insufficient curing tends to occur. When the amount is too large, the product life tends to decrease.

The thermo-polymerizable composition preferably contain a film forming resin and a silane coupling agent. Examples of the film forming resin may include, phenoxy resins, epoxy resins, unsaturated polyester resins, saturated polyester resins, urethane resins, butadiene resins, polyimide resins, polyamide resins, and polyolefin resins. Two or more of these may be used in combination. Among these, phenoxy resins may be preferred from the standpoint of film forming ability, processability, and connection reliability. Examples of the silane coupling agent may include epoxy silane coupling agents and acrylic silane coupling agents. These silane coupling agents are mostly alkoxy silane derivatives.

Optionally, the thermo-polymerizable composition may contain one or more additives. Examples thereof include fillers, softeners, promoters, antioxidants, colorants (pigments and dyes), organic solvents, and ion-trapping agents.

The thickness of the electrically insulating base layer 1, which is made of the thermo-polymerizable composition described above, preferably ranges from 3 to 50 μm, and more preferably from 5 to 20 μm.

Intermediate Layer 2

The intermediate layer 2 may include the thermo-polymerizable compound and the thermal polymerization initiator as used in electrically insulating base layer 1. In such a case, the intermediate layer 2 is also a layer of a thermo-polymerizable composition containing a thermo-polymerizable compound and a thermal polymerization initiator and is capable of retaining the electrically conductive particles 4. As previously described, the intermediate layer 2 has a melt viscosity higher than the melt viscosity of the electrically insulating base layer 1 and therefore improves the capturing properties of the electrically conductive particle 4.

The thickness of the intermediate layer 2 preferably ranges from 1 to 50 μm and more preferably from 2 to 20 μm. It is preferable that the thickness of the intermediate layer 2 not be greater than the thickness of the electrically insulating base layer 1.

Adhesive Layer 3

The adhesive layer 3 is a layer for ensuring that the anisotropic conductive film 10 exhibits good adhesion even when the intermediate layer 2 does not have sufficient adhesion. The adhesive layer 3 may be a layer of a composition similar to the thermo-polymerizable composition constituting the electrically insulating base layer 1 or that constituting the intermediate layer 2.

The thickness of the adhesive layer 3 preferably ranges from 1 to 50 μm, and more preferably from 1 to 20 μm. It is preferable that the thickness of the adhesive layer 3 not be greater than the thickness of the electrically insulating base layer 1. The sum of the thicknesses of the adhesive layer 3 and the intermediate layer 2 is preferably from 1 to 10 times the thickness of the electrically insulating base layer 1.

Electrically Conductive Particle 4

The electrically conductive particles 4 may be the same as those used in any of existing known anisotropic conductive films. Selection of the electrically conductive particles may be made appropriately. Examples thereof include particles of metal, such as nickel, cobalt, silver, copper, gold, or palladium, particles of an alloy, such as solder, and metal-coated resin particles. A combination of two or more materials may also be used.

The average particle diameter of the electrically conductive particles 4 preferably ranges from 1 μm to 30 μm, and more preferably from 3 μm to 9 μm. The reason for this is to accommodate variations in the height of the wiring, inhibit an increase in conduction resistance, and inhibit the occurrence of a short circuit. The particle diameter of the electrically conductive particles 4 can be measured using a common particle size distribution analyzer, and the average particle diameter can also be determined using the particle size distribution analyzer.

When the electrically conductive particles 4 are metal-coated resin particles, the particle hardness of the resin core particles (20% K value: compressive elastic deformation characteristics $K_{20}$) preferably ranges from 100 to 10000 kgf/mm$^2$, and more preferably from 1000 to 7000 kgf/mm$^2$ in order to achieve good connection reliability.

The abundance of the electrically conductive particles 4 in the anisotropic conductive film 10 preferably ranges from 50 per square millimeter to 100000 per square millimeter, and more preferably from 200 per square millimeter to 70000 per square millimeter, in order to inhibit a decrease in the efficiency of electrically conductive particle capturing and inhibit the occurrence of a short circuit. Measurement of the abundance can be performed by observing the film surface using an optical microscope.

The abundance of the electrically conductive particles 4 in the anisotropic conductive film 10 can also be expressed on a mass basis.

Specifically, the abundance preferably ranges from 1 part by mass to 30 parts by mass, and more preferably from 3 parts by mass to 10 parts by mass, per 100 parts by mass with the total mass of the anisotropic conductive film 10 being taken as 100 parts by mass.

Method for Producing Anisotropic Conductive Film

The anisotropic conductive film of FIG. 1 of the present invention can be produced by, for example, preparing an intermediate layer made from a thermo-polymerizable composition and retaining electrically conductive particles on a surface, placing an electrically insulating base layer, which is prepared separately, on one surface of the intermediate layer, placing an adhesive layer, which is prepared separately, on the other surface of the intermediate layer, and bonding the layers together. To provide the intermediate layer retaining electrically conductive particles, an existing known technique may be used. For example, the electrically conductive particles may be directly sprayed on the film of the intermediate layer so that the intermediate layer can retain the electrically conductive particles. Another technique is as follows. Electrically conductive particles in a single layer are adhered to an adhesive layer for stretching and this is subjected to biaxial stretching. The intermediate layer is pressed against the stretched film to transfer the electrically conductive particles onto the intermediate layer so that the intermediate layer can retain the electrically conductive particles. Another technique is to use a transfer mold to provide the intermediate layer retaining electrically conductive particles. An example of production of an anisotropic conductive film of the present invention using a transfer mold will be described below.

The anisotropic conductive film 10 illustrated in FIG. 1 (FIG. 5) can be produced in accordance with the following steps A to D.

First, a transfer mold having plural concaves is provided and electrically conductive particles are placed into the concaves (step A). Subsequently, a thermo-polymerizable composition containing a thermo-polymerizable compound and a thermal polymerization initiator, and optionally an electrically insulating filler, is pressed against the electrically conductive particles within the transfer mold to form an intermediate layer where the electrically conductive particles are transferred (step B). Next, separately from the intermediate layer, an electrically insulating base layer is formed by depositing a film of thermo-polymerizable composition containing a thermo-polymerizable compound and a thermal polymerization initiator (step C), and in the same manner, an adhesive layer is formed (step D). The adhesive layer is placed on the surface, of the intermediate layer, where the electrically conductive particles are transferred, the electrically insulating base layer is placed on the surface thereof where the electrically conductive particles are not transferred, and the layers are bonded together. In this manner, the anisotropic conductive film 10 of FIG. 1 (FIG. 5) can be obtained.

By adjusting the pressing in step B, the degree of embedding of the electrically conductive particles into the intermediate layer can be varied. When the degree of pressing is increased, the degree of embedding of the electrically conductive particles into the intermediate layer is increased. The electrically conductive particles can be fully embedded in the intermediate layer eventually. In this manner, the anisotropic conductive film in FIG. 4 can also be produced.

By placing the electrically insulating base layer on the surface, of the intermediate layer, where the electrically conductive particles are transferred and placing the adhesive layer on the surface thereof where the electrically conductive particles are not transferred, the anisotropic conductive film in FIG. 3 can be obtained. By changing the target in which the electrically conductive particles are to be embedded from the intermediate layer to the adhesive layer, the anisotropic conductive film in FIG. 2 can be produced.

Transfer Mold

The transfer mold used in the production methods of the present invention may be a mold made of an inorganic material or an organic material and having openings formed by a known opening forming process, such as photolithography. Examples of the inorganic material include silicon, various ceramics, glass, and metal such as stainless steel. Examples of the organic material include various resins. The transfer mold may have a plate shape, a roll shape, or another shape.

Examples of the shape of the concaves of the transfer mold may include columnar shapes, such as cylindrical or quadrangular prismatic, and cone or pyramid shapes, such as truncated conical, truncated pyramidal, conical, or pyramidal.

The arrangements of the concaves may be appropriately configured in accordance with the arrangements that the electrically conductive particles will form. Examples thereof include a lattice form and a staggered lattice form.

The ratio of the average particle diameter of the electrically conductive particles to the depth of the concaves (average particle diameter of electrically conductive particles/depth of openings) preferably ranges from 0.4 to 3.0, and more preferably from 0.5 to 1.5, for a good balance between improvement of ease of transfer and the ability to retain the electrically conductive particles. The diameter and depth of the concaves of the transfer mold can be measured using a laser microscope.

The ratio of the opening diameter of the concaves to the average particle diameter of the electrically conductive particles (opening diameter of concaves/average particle diameter of electrically conductive particles) preferably ranges from 1.1 to 2.0, and more preferably from 1.3 to 1.8, for a good balance between, for example, ease of accommodation of the electrically conductive particles and ease of pushing of the electrically insulating resin.

When the bottom diameter of the concaves is smaller than the opening diameter thereof, the bottom diameter is preferably from 1.1 to less than 2 times the diameter of the electrically conductive particles, and the opening diameter is preferably from 1.3 to less than 3 times the diameter of the electrically conductive particles.

Connection Structure

Anisotropic conductive films according to the present invention can be advantageously used when anisotropically conductively connecting a first electronic component, such as an IC chip, an IC module, or an FPC, to a second electronic component, such as an FPC, a glass substrate, a rigid substrate, or a ceramic substrate. Connection structures formed in this way are included within the scope of the present invention.

An example of a method for connecting electronic components to each other using the anisotropic conductive film may be as follows. The anisotropic conductive film is temporarily bonded to a second electronic component, such as any of a variety of substrates, from the adhesive layer side and a first electronic component, such as an IC chip, is mounted to the temporarily bonded anisotropic conductive film, and this is subjected to thermocompression bonding. In this manner, the connection can be performed.

EXAMPLES

The present invention will be described in more detail below with reference to examples. The modulus of elasticity was measured in accordance with JIS K7244-4 using a dynamic viscoelastometer (DDV01FP-W, manufactured by A&D Company, Limited) under the following conditions: tensile mode; frequency: 11 Hz; rate of temperature increase: 3° C./min; and measurement temperature range: from 0 to 260° C. The glass transition temperature was determined as follows. The storage elastic modulus E' and loss elastic modulus E" were measured in accordance with JIS K7244-4, and from these, tan Δ was calculated. The temperature at the maximum tan Δ was designated as the glass transition temperature. The melt viscosity was measured using a rotary rheometer (manufactured by TA Instruments) under the following conditions: rate of temperature increase: 10° C./min; measurement pressure: constant at 5 g; measurement plate used: 8 mm in diameter; and measurement temperature: 80° C.

The blending compositions of the layers that constitute the anisotropic conductive films of the following examples and comparative examples are shown in Table 1. The configurations (corresponding drawings), sizes (thicknesses), and properties of the layers of the anisotropic conductive films and results of evaluations of the anisotropic conductive films are shown in Table 2.

Example 1 (Production of Anisotropic Conductive Film of FIG. 1)

Formation of Electrically Insulating Base Layer

A thermo-polymerizable composition containing 40 parts by mass of a phenoxy resin (YP-50, manufactured by Nippon Steel & Sumikin Chemical Co., Ltd.), 5 parts by mass of a silica filler (AEROSIL R805, manufactured by NIPPON AEROSIL CO., LTD.), 55 parts by mass of a liquid epoxy resin (jER 828, manufactured by Mitsubishi Chemical Corporation), 4 parts by mass of a thermal cationic polymerization initiator (SI-60L, manufactured by Sanshin Chemical Industry Co., Ltd.), and 1 part by mass of a silane coupling agent (KBM-403, manufactured by Shin-Etsu Chemical Co., Ltd.) was prepared. This composition was applied to a PET film having a film thickness of 50 μm using a bar coater and dried in an 80° C. oven for five minutes. Thus, an adhesive electrically insulating base layer having a thickness shown in Table 2 (14 μm) was formed on the PET film. The melt viscosity of the electrically insulating base layer is shown in Table 2.

Formation of Intermediate Layer

A mold having a pattern of arrangements of projections corresponding to a square lattice pattern was produced. Pellets of known transparent resin were melted and poured into the mold, and then cooled and solidified. Thus, a resin transfer mold having concaves in a square lattice pattern of the density in Table 2 (corresponding to the particle density of the electrically conductive particles) was produced. Electrically conductive particles (AUL703, manufactured by SEKISUI CHEMICAL CO., LTD., particle diameter: 3 μm) were loaded into the concaves of the transfer mold.

Separately from this, a thermo-polymerizable composition containing 40 parts by mass of a phenoxy resin (YP-50, manufactured by Nippon Steel & Sumikin Chemical Co., Ltd.), 30 parts by mass of a silica filler (AEROSIL R805, manufactured by NIPPON AEROSIL CO., LTD.), 30 parts by mass of a liquid epoxy resin (jER 828, manufactured by Mitsubishi Chemical Corporation), 4 parts by mass of a thermal cationic polymerization initiator (SI-60L, manufactured by Sanshin Chemical Industry Co., Ltd.), and 1 part by mass of a silane coupling agent (KBM-403, manufactured by Shin-Etsu Chemical Co., Ltd.) was prepared. This thermo-polymerizable composition was applied to a PET film having a film thickness of 50 μm and dried in an 80° C. oven for five minutes. Thus, an adhesive intermediate layer having a thickness shown in Table 2 (2 μm) was produced. This intermediate layer was pressed against the electrically conductive particle holding surface of the transfer mold using an elastic roller under the following conditions: pressing temperature: 50° C.; and pressing force: 0.5 MPa. Thus, an intermediate layer where the electrically conductive particles were transferred was formed, and removed from the transfer mold. With regard to this intermediate layer, the melt viscosity, the percentage of independent electrically conductive particles relative to the total electrically conductive particles, and the area occupancy ratio of the electrically conductive particles are shown in Table 2.

Formation of Adhesive Layer

A thermo-polymerizable composition containing 50 parts by mass of a phenoxy resin (YP-50, manufactured by Nippon Steel & Sumikin Chemical Co., Ltd.), 20 parts by mass of a silica filler (AEROSIL R805, manufactured by NIPPON AEROSIL CO., LTD.), 30 parts by mass of a liquid epoxy resin (jER 828, manufactured by Mitsubishi Chemical Corporation), 4 parts by mass of a thermal cationic polymerization initiator (SI-60L, manufactured by Sanshin Chemical Industry Co., Ltd.), and 1 part by mass of a silane coupling agent (KBM-403, manufactured by Shin-Etsu Chemical Co., Ltd.) was prepared. This composition was applied to a PET film having a film thickness of 50 μm using a bar coater and dried in an 80° C. oven for five minutes. Thus, an adhesive layer having a thickness shown in Table 2 (2 μm) was formed on the PET film. The melt viscosity of the adhesive layer is shown in Table 2.

Lamination of Electrically Insulating Base Layer, Intermediate Layer, and Adhesive Layer The electrically insulating base layer was positioned to face the surface, of the intermediate layer, where the electrically conductive particles were not transferred. The adhesive layer was positioned to face the surface thereof where the electrically conductive particles were transferred. The layers were bonded together under the following conditions: pressing temperature: 50° C.; and pressing force: 0.2 MPa, to produce an anisotropic conductive film of FIG. 1. The modulus of elasticity and the glass transition temperature of the obtained anisotropic conductive film are shown in Table 2.

Example 2 (Production of Anisotropic Conductive Film of FIG. 1)

An anisotropic conductive film was produced in the same manner as in Example 1 except for the following differences. For the thermo-polymerizable composition used for the adhesive layer, the amount of the phenoxy resin was changed from 50 parts by mass to 40 parts by mass, and the amount of the silica filler was changed from 20 parts by mass to 30 parts by mass. For the thermo-polymerizable composition used for the intermediate layer, the amount of the phenoxy resin was changed from 40 parts by mass to 50 parts by mass, and the amount of the silica filler was changed from 30 parts by mass to 20 parts by mass. The modulus of elasticity and the glass transition temperature of the obtained anisotropic conductive film are shown in Table 2.

Example 3 (Production of Anisotropic Conductive Film of FIG. 1)

An anisotropic conductive film was produced in the same manner as in Example 1 except for the following differences. For the thermo-polymerizable composition used for the intermediate layer, the amount of the phenoxy resin was changed from 40 parts by mass to 50 parts by mass, and the amount of the silica filler was changed from 30 parts by mass to 20 parts by mass. The modulus of elasticity and the glass transition temperature of the obtained anisotropic conductive film are shown in Table 2.

Example 4 (Production of Anisotropic Conductive Film of FIG. 1)

An anisotropic conductive film was produced in the same manner as in Example 1 except for the following differences. For the thermo-polymerizable composition used for the adhesive layer, the amount of the phenoxy resin was changed from 50 parts by mass to 40 parts by mass, and the amount of the silica filler was changed from 20 parts by mass to 30 parts by mass. The modulus of elasticity and the glass transition temperature of the obtained anisotropic conductive film are shown in Table 2.

Example 5 (Production of Anisotropic Conductive Film of FIG. 1)

An anisotropic conductive film was produced in the same manner as in Example 1 except for the following differences. For the thermo-polymerizable composition used for the adhesive layer, the amount of the phenoxy resin was changed from 50 parts by mass to 30 parts by mass, and the amount of the silica filler was changed from 20 parts by mass to 40 parts by mass. For the thermo-polymerizable composition used for the intermediate layer, the amount of the phenoxy resin was changed from 40 parts by mass to 30 parts by mass, and the amount of the silica filler was changed from 30 parts by mass to 40 parts by mass. The modulus of elasticity and the glass transition temperature of the obtained anisotropic conductive film are shown in Table 2.

Example 6 (Production of Anisotropic Conductive Film of FIG. 1)

An anisotropic conductive film was produced in the same manner as in Example 1 except for the following differences. For the thermo-polymerizable composition used for the electrically insulating base layer, the amount of the phenoxy resin was changed from 40 parts by mass to 30 parts by mass, and the amount of the silica filler was changed from 5 parts by mass to 15 parts by mass. For the thermo-polymerizable composition used for the intermediate layer, the amount of the phenoxy resin was changed from 40 parts by mass to 30 parts by mass, and the amount of the silica filler was changed from 30 parts by mass to 40 parts by mass. For the thermo-polymerizable composition used for the adhesive layer, the amount of the phenoxy resin was changed from 50 parts by mass to 30 parts by mass, and the amount of the silica filler was changed from 20 parts by mass to 40 parts by mass.

Figure 2:
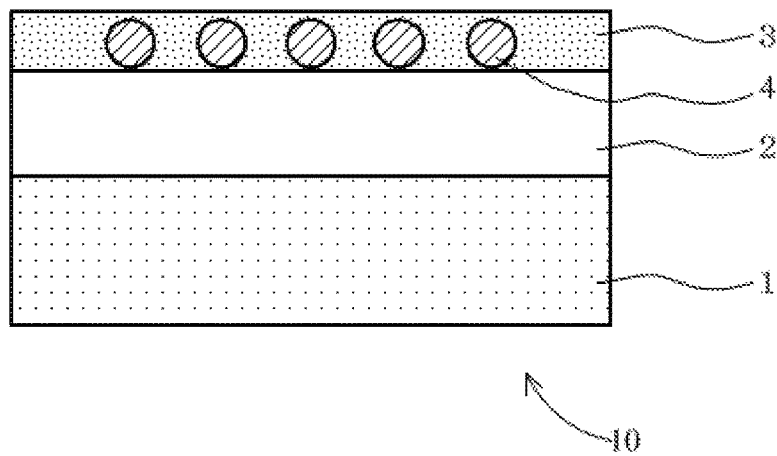
FIG. 2 is a cross-sectional view of an anisotropic conductive film of the invention of the present application.

Example 7 (Production of Anisotropic Conductive Film of FIG. 2)

An anisotropic conductive film of FIG. 2 was produced in the same manner as in Example 1 except for the following differences. Instead of the intermediate layer, the adhesive layer was pressed against the electrically conductive particle holding surface of the transfer mold to form an adhesive layer where the electrically conductive particles were transferred (substantially embedded). The conditions were changed to a pressing temperature of 60° C. and a pressing force of 1.0 MPa. The intermediate layer was positioned to face the surface, of the adhesive layer, where the electrically conductive particles were transferred, and the electrically insulating base layer was positioned to face the intermediate layer. The layers were bonded together under the following conditions: pressing temperature: 50° C.; and pressing force: 0.2 MPa. The modulus of elasticity and the glass transition temperature of the obtained anisotropic conductive film are shown in Table 2.

Example 8 (Production of Anisotropic Conductive Film of FIG. 3)

The electrically insulating base layer was positioned to face the surface, of the intermediate layer, where the electrically conductive particles were transferred. The adhesive layer was positioned to face the surface thereof where the electrically conductive particles were not transferred. The layers were bonded together under the following conditions: pressing temperature: 50° C.; and pressing force: 0.2 MPa, to produce an anisotropic conductive film of FIG. 3. The modulus of elasticity and the glass transition temperature of the obtained anisotropic conductive film are shown in Table 2.

Example 9 (Production of Anisotropic Conductive Film of FIG. 4)

An anisotropic conductive film of FIG. 4 was produced in the same manner as in Example 1 except for the following differences. The conditions for transferring the electrically conductive particles to the intermediate layer were changed to a pressing temperature of 60° C. and a pressing force of 1.0 MPa to embed the electrically conductive particles into the intermediate layer. The modulus of elasticity and the glass transition temperature of the obtained anisotropic conductive film are shown in Table 2.

Example 10 (Production of Anisotropic Conductive Film of FIG. 1)

An anisotropic conductive film was produced and prepared in the same manner as in Example 1 except for the following differences. For each layer, 4 parts by mass of a thermal cationic polymerization initiator (SI-60L, manufactured by Sanshin Chemical Industry Co., Ltd.) was replaced with 4 parts by mass of a photocationic polymerization initiator (ADEKA OPTOMER SP-171, manufactured by ADEKA Corporation).

Figure 6:
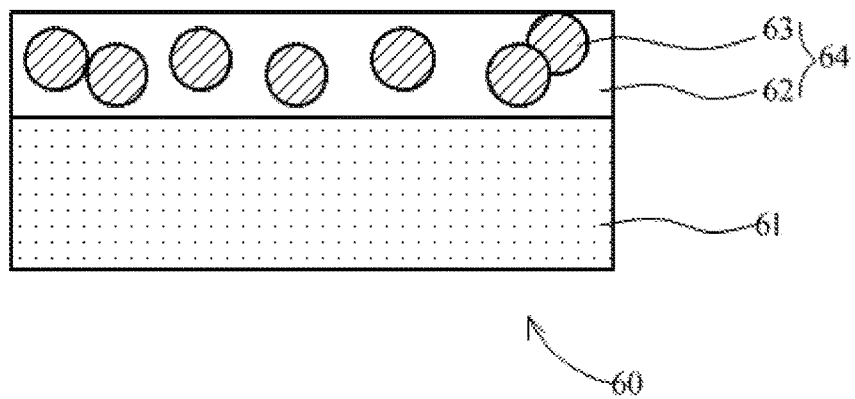
FIG. 6 is a cross-sectional view of an anisotropic conductive film of the related art (Comparative Example 1).

Comparative Example 1 (Production of Anisotropic Conductive Film of FIG. 6)

Formation of Adhesive Layer

A thermo-polymerizable composition in which electrically conductive particles were dispersed was prepared by mixing 40 parts by mass of a phenoxy resin (YP-50, manufactured by Nippon Steel & Sumikin Chemical Co., Ltd.), 30 parts by mass of a silica filler (AEROSIL R805, manufactured by NIPPON AEROSIL CO., LTD.), 30 parts by mass of a liquid epoxy resin (jER 828, manufactured by Mitsubishi Chemical Corporation), 4 parts by mass of a thermal cationic polymerization initiator (SI-60L, manufactured by Sanshin Chemical Industry Co., Ltd.), 1 part by mass of a silane coupling agent (KBM-403, manufactured by Shin-Etsu Chemical Co., Ltd.), and 40 parts by mass of electrically conductive particles (AUL703, manufactured by SEKISUI CHEMICAL CO., LTD., particle diameter: 3 μm). This thermo-polymerizable composition was applied to a PET film having a film thickness of 50 μm using a bar coater and dried in an 80° C. oven for five minutes. Thus, an adhesive layer having a thickness shown in Table 2 (4 μm) was formed on the PET film. The melt viscosity of the adhesive layer is shown in Table 2.

Formation of Electrically Insulating Base Layer

The same electrically insulating base layer as in Example 1 was prepared.

Lamination of Electrically Insulating Base Layer and Adhesive Layer

The adhesive layer and the electrically insulating base layer were positioned to face each other. The layers were bonded together under the following conditions: pressing temperature: 50° C.; and pressing force: 0.2 MPa, to produce a double layer structured anisotropic conductive film of FIG. 6. The modulus of elasticity and the glass transition temperature of the obtained anisotropic conductive film are shown in Table 2.

Figure 7:
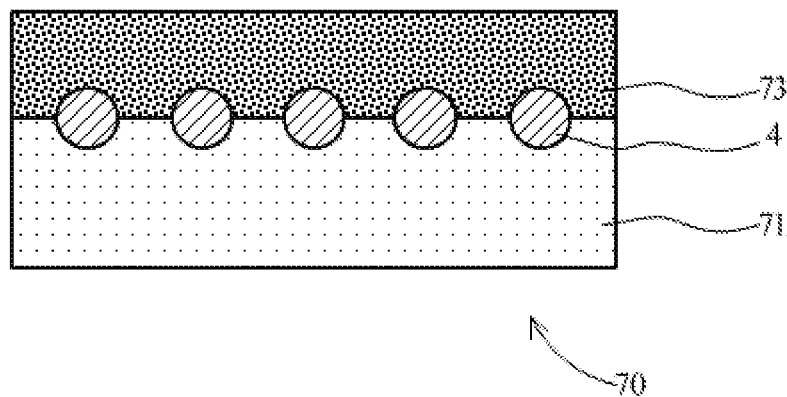
FIG. 7 is a cross-sectional view of an anisotropic conductive film of Comparative Example 2.

Comparative Example 2 (Production of Anisotropic Conductive Film of FIG. 7)

Formation of Adhesive Layer

A photopolymerizable composition in which electrically conductive particles were dispersed was prepared by mixing 30 parts by mass of a phenoxy resin (YP-50, manufactured by Nippon Steel & Sumikin Chemical Co., Ltd.), 20 parts by mass of a silica filler (AEROSIL R805, manufactured by NIPPON AEROSIL CO., LTD.), 30 parts by mass of a liquid epoxy resin (jER 828, manufactured by Mitsubishi Chemical Corporation), 20 parts by mass of a photoradical polymerizable resin (EB600, manufactured by DAICEL-ALLNEX LTD.), 3 parts by mass of a photoradical polymerization initiator (IRGACURE 369, manufactured by BASF Japan Ltd.), and 1 part by mass of a silane coupling agent (KBM-403, manufactured by Shin-Etsu Chemical Co., Ltd.). This photopolymerizable composition was applied to a PET film having a film thickness of 50 µm using a bar coater and dried in an 80° C. oven for five minutes. Thus, an adhesive layer having a thickness shown in Table 2 (4 µm) was formed on the PET film. The melt viscosity of the adhesive layer is shown in Table 2.

As with Example 1, this adhesive layer was pressed against the electrically conductive particle holding surface of the transfer mold under the following conditions: pressing temperature: 50° C.; and pressing force: 0.5 MPa. Thus, an adhesive layer where the electrically conductive particles were transferred was formed, and removed from the transfer mold. With regard to this adhesive layer, the melt viscosity, the percentage of independent electrically conductive particles relative to the total electrically conductive particles, and the area occupancy ratio of the electrically conductive particles are shown in Table 2.

Formation of Electrically Insulating Base Layer

The same electrically insulating base layer as in Example 1 was prepared.

Lamination of Electrically Insulating Base Layer and Adhesive Layer

The electrically insulating base layer was positioned to face the surface, of the adhesive layer, where the electrically conductive particles were transferred. The layers were bonded together under the following conditions: pressing temperature: 50° C.; and pressing force: 0.2 MPa, and then irradiated with ultraviolet light of a wavelength of 365 nm at an integrated light amount of 4000 mJ/cm$^2$. Thus, a double layer structured anisotropic conductive film 70 of FIG. 7 was produced. The anisotropic conductive film 70 includes a thermo-polymerizable electrically insulating base layer 71, a photocured adhesive layer 73, and the electrically conductive particles 4 retained at the interface between the layers. The modulus of elasticity and the glass transition temperature of the obtained anisotropic conductive film are shown in Table 2.

Figure 8:
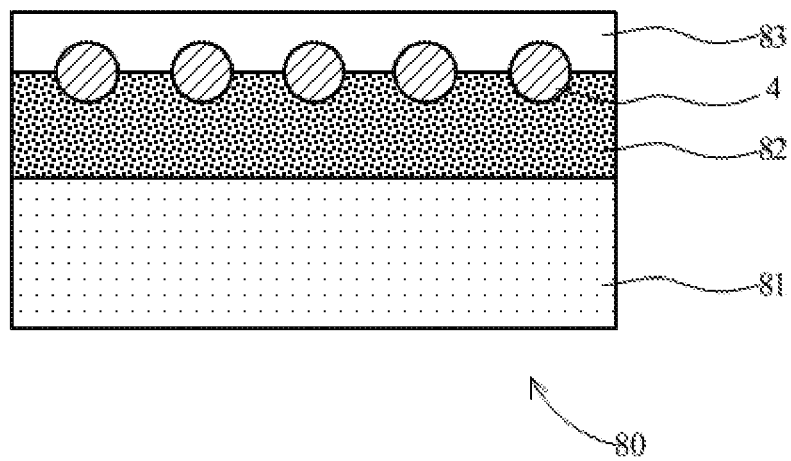
FIG. 8 is a cross-sectional view of an anisotropic conductive film of Comparative Example 3.

Comparative Example 3 (Production of Anisotropic Conductive Film of FIG. 8)

Formation of Electrically Insulating Base Layer

The same electrically insulating base layer as in Example 1 was prepared.

Formation of Intermediate Layer

A photopolymerizable composition containing 30 parts by mass of a phenoxy resin (YP-50, manufactured by Nippon Steel & Sumikin Chemical Co., Ltd.), 20 parts by mass of a silica filler (AEROSIL R805, manufactured by NIPPON AEROSIL CO., LTD.), 30 parts by mass of a liquid epoxy resin (jER 828, manufactured by Mitsubishi Chemical Corporation), 20 parts by mass of a photoradical polymerizable resin (EB600, manufactured by DAICEL-ALLNEX LTD.), 3 parts by mass of a photoradical polymerization initiator (IRGACURE 369, manufactured by BASF Japan Ltd.), and 1 part by mass of a silane coupling agent (KBM-403, manufactured by Shin-Etsu Chemical Co., Ltd.) was prepared. This thermo-polymerizable composition was applied to a PET film having a film thickness of 50 µm and dried in an 80° C. oven for five minutes. Thus, an adhesive intermediate layer having a thickness shown in Table 2 (4 µm) was produced. As with Example 1, this intermediate layer was pressed against the electrically conductive particle holding surface of the transfer mold. Thus, an intermediate layer where the electrically conductive particles were transferred was formed, and removed from the transfer mold. With regard to this intermediate layer, the melt viscosity, the percentage of independent electrically conductive particles relative to the total electric ally conductive particles, and the area occupancy ratio of the electrically conductive particles are shown in Table 2.

Formation of Adhesive Layer

An adhesive layer was prepared which contained 35 parts by mass of a phenoxy resin (YP-50, manufactured by Nippon Steel & Sumikin Chemical Co., Ltd.), 10 parts by mass of a silica filler (AEROSIL R805, manufactured by NIPPON AEROSIL CO., LTD.), 55 parts by mass of a liquid epoxy resin (jER 828, manufactured by Mitsubishi Chemical Corporation), 4 parts by mass of a thermal cationic polymerization initiator (SI-60L, manufactured by Sanshin Chemical Industry Co., Ltd.), and 1 part by mass of a silane coupling agent (KBM-403, manufactured by Shin-Etsu Chemical Co., Ltd.).

Lamination of Electrically Insulating Base Layer, Intermediate Layer, and Adhesive Layer The adhesive layer was positioned to face the surface, of the intermediate layer, where the electrically conductive particles were transferred and the electrically insulating base layer was positioned to face the surface thereof where the electrically conductive particles were not transferred. The layers were bonded together under the following conditions: pressing temperature: 50° C.; and pressing force: 0.2 MPa, and then irradiated with ultraviolet light of a wavelength of 365 nm at an integrated light amount of 4000 mJ/cm$^2$. Thus, an anisotropic conductive film 80 of FIG. 8 was produced. The anisotropic conductive film 80 includes a lamination of a thermo-polymerizable electrically insulating base layer 81, a photocured intermediate layer 82, and a thermo-polymerizable adhesive layer 83, with the electrically conductive particles 4 retained at the interface between the intermediate layer 82 and the adhesive layer 83.

Figure 9:
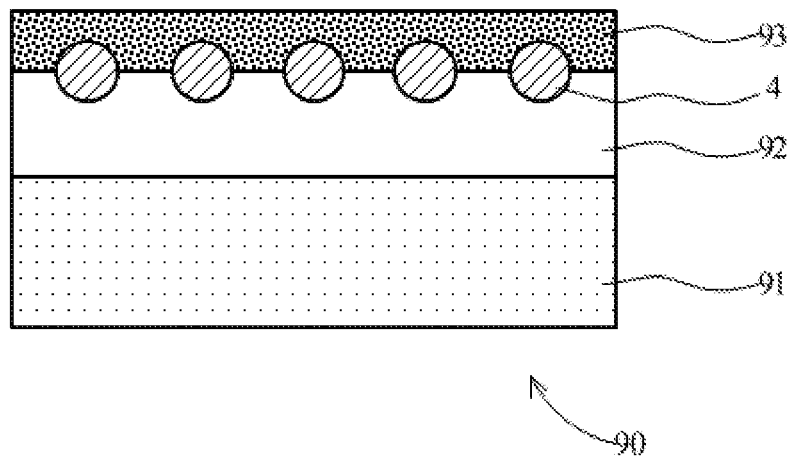
FIG. 9 is a cross-sectional view of an anisotropic conductive film of Comparative Example 4.

Comparative Example 4 (Production of Anisotropic Conductive Film of FIG. 9)

Formation of Adhesive Layer

A photopolymerizable composition in which electrically conductive particles were dispersed was prepared by mixing 30 parts by mass of a phenoxy resin (YP-50, manufactured by Nippon Steel & Sumikin Chemical Co., Ltd.), 20 parts by mass of a silica filler (AEROSIL R805, manufactured by NIPPON AEROSIL CO., LTD.), 30 parts by mass of a liquid epoxy resin (jER 828, manufactured by Mitsubishi Chemical Corporation), 20 parts by mass of a photoradical polymerizable resin (EB600, manufactured by DAICEL-ALLNEX LTD.), 3 parts by mass of a photoradical polymerization initiator (IRGACURE 369, manufactured by BASF Japan Ltd.), and 1 part by mass of a silane coupling agent (KBM-403, manufactured by Shin-Etsu Chemical Co., Ltd.). This photopolymerizable composition was applied to a PET film having a film thickness of 50 μm using a bar coater and dried in an 80° C. oven for five minutes. Thus, an adhesive layer having a thickness shown in Table 2 (2 μm) was formed on the PET film. The melt viscosity of the adhesive layer is shown in Table 2.

Formation of Intermediate Layer

An intermediate layer was prepared which contained 35 parts by mass of a phenoxy resin (YP-50, manufactured by Nippon Steel & Sumikin Chemical Co., Ltd.), 10 parts by mass of a silica filler (AEROSIL R805, manufactured by NIPPON AEROSIL CO., LTD.), 55 parts by mass of a liquid epoxy resin (jER 828, manufactured by Mitsubishi Chemical Corporation), 4 parts by mass of a thermal cationic polymerization initiator (SI-60L, manufactured by Sanshin Chemical Industry Co., Ltd.), and 1 part by mass of a silane coupling agent (KBM-403, manufactured by Shin-Etsu Chemical Co., Ltd.). This intermediate layer included electrically conductive particles transferred thereon similarly to that of Example 1.

Formation of Electrically Insulating Base Layer

The same electrically insulating base layer as in Example 1 was prepared.

Lamination of Electrically Insulating Base Layer, Intermediate Layer, and Adhesive Layer The adhesive layer was positioned to face the surface, of the intermediate layer, where the electrically conductive particles were transferred and the electrically insulating base layer was positioned to face the surface thereof where the electrically conductive particles were not transferred. The layers were bonded together under the following conditions: pressing temperature: 50° C.; and pressing force: 0.2 MPa, and then irradiated with ultraviolet light of a wavelength of 365 nm at an integrated light amount of 4000 mJ/cm$^2$. Thus, an anisotropic conductive film 90 of FIG. 9 was produced. The anisotropic conductive film 90 includes a lamination of a thermo-polymerizable electrically insulating base layer 91, a thermo-polymerizable intermediate layer 92, and a photocured adhesive layer 93, with the electrically conductive particles 4 retained at the interface between the intermediate layer 92 and the adhesive layer 93. The modulus of elasticity and the glass transition temperature of the obtained anisotropic conductive film are shown in Table 2.

Evaluation

Using each of the anisotropic conductive films of Examples 1 to 10 and Comparative Examples 1 to 4, connection structures for evaluation were produced by anisotropically conductively connecting the following IC for evaluation to the following glass circuit board via thermocompression bonding connection under the following conditions (for Example 10, the following UV irradiation was also performed).

IC for evaluation: outer size=1.8 mm×20 mm×0.2 mm, gold bump specifications=15 μm (height)×15 μm (width)× 100 μm (length) (inter-bump gap: 15 μm)

ITO coated glass circuit board: outer size=30 mm×50 mm×0.5 mm

Thermocompression bonding connection: thermocompression bonding from IC chip side, at 150° C. and 80 MPa for 5 seconds.

UV irradiation connection: thermocompression bonding at 100° C. and at a pressure of 80 MPa for five seconds, and four seconds after start of the thermocompression bonding, i-line light irradiation for 1 second using a UV irradiator (ZUV-C30H, manufactured by OMRON Corporation).

Evaluations of the produced connection structures for evaluation were made as described below, regarding (a) initial conduction resistance, (b) conduction reliability, (c) short circuit occurrence rate, (d) temporary bonding properties, and (e) particle capturing properties. The obtained results are shown in Table 2.

(a) Initial Conduction Resistance

The conduction resistances of the obtained connection structures for evaluation were measured using a digital multi-meter by 4-terminal sensing with passage of a 2 mA current. The measured resistance value is desirably not greater than 2Ω for practical use.

(b) Conduction Reliability

The conduction resistance of each of the obtained connection structures for evaluation was measured in the same manner as that for the initial conduction resistance, after the structures were placed in a thermostatic chamber at a temperature of 85° C. and a humidity of 85% RH for 500 hours. The measured resistance value is desirably not greater than 6Ω for practical use.

(c) Short Circuit Occurrence Rate

When connection structures were produced, the IC for evaluation was changed to the following IC (comb-shaped TEG (test element group) with a space of 7.5 μm). The short circuit occurrence rate of each of the obtained connection structures was measured using a digital multi-meter, and evaluations were made based on the following criteria.

Outer size: 1.5 mm×13 mm

Thickness: 0.5 mm

Bump specifications: gold plated, height: 15 μm, size: 25 μm×140 μm, inter-bump gap: 7.5 μm Evaluation Criteria OK (good): short circuit occurrence rate was less than 200 ppm.

NG (poor): short circuit occurrence rate was greater than or equal to 200 ppm.

(d) Temporary Bonding Properties

Using a commercially available ACF bonder (model number: TTO-1794M, manufactured by SHIBAURA MECHATRONICS CORPORATION), each of the anisotropic conductive films was affixed, at a size of 2 mm×5 cm, to a glass circuit board and was temporarily bonded at a pressure of 1 MPa so that the temperature reached after one second can be within a range from 40 to 80° C. Visual observation was made to see whether peeling or delamination of the anisotropic conductive film from the glass circuit board occurs when the glass circuit board was turned over. Evaluations were made based on the following criteria.

Evaluation Criteria

A (excellent): good temporary bonding was accomplished at 40° C.

B (good): temporary bonding was not accomplished at 40° C. but was accomplished at 60° C.

C (fair): temporary bonding was not accomplished at 60° C. but was accomplished at 80° C.

D (poor): temporary bonding was not accomplished at 80° C.

(e) Particle Capturing Properties

Terminals after connection were observed from the glass substrate side using a metallurgical microscope and the number of indentations was counted. Thus, the electrically conductive particle capturing properties were determined. The evaluation criteria are set forth below. In Table 2, "e-1" shows results of evaluations of particle capturing properties in the case where the connection area on the IC chip (chip size: 15 μm×100 μm) was 1500 μm², and "e-2" shows results of evaluations of particle capturing properties in the case where the connection area on the IC chip was 800 μm² with the alignment being displaced by 7 μm.

Evaluation Criteria
A (excellent): 10 or more particles
B (good): from 5 to 9 particles
C (fair): from 3 to 4 particles
D (poor): less than 3 particles

TABLE 1

|  |  |  | Examples |  |  |  |  |  |  |  |  |  | Comparative Examples |  |  |  |
|---|---|---|---|---|---|---|---|---|---|---|---|---|---|---|---|---|
|  |  |  | 1 | 2 | 3 | 4 | 5 | 6 | 7 | 8 | 9 | 10 | 1 | 2 | 3 | 4 |
| Electrically insulating base layer | Phenoxy resin | YP-50 | 40 | 40 | 40 | 40 | 40 | 30 | 40 | 40 | 40 | 40 | 40 | 40 | 40 | 40 |
|  | Silica filler | R805 | 5 | 5 | 5 | 5 | 5 | 15 | 5 | 5 | 5 | 5 | 5 | 5 | 5 | 5 |
|  | Liquid epoxy resin | jER828 | 55 | 55 | 55 | 55 | 55 | 55 | 55 | 55 | 55 | 55 | 55 | 55 | 55 | 55 |
|  | Thermal cationic polymerization initiator | SI-60L | 4 | 4 | 4 | 4 | 4 | 4 | 4 | 4 | 4 |  | 4 | 4 | 4 | 4 |
|  | Photocationic polymerization initiator | ADEKA OPTOMER SP-171 |  |  |  |  |  |  |  |  |  | 4 |  |  |  |  |
|  | Silane coupling agent | KBM-403 | 1 | 1 | 1 | 1 | 1 | 1 | 1 | 1 | 1 | 1 | 1 | 1 | 1 | 1 |
| Intermediate layer | Phenoxy resin | YP-50 | 40 | 50 | 50 | 40 | 30 | 30 | 40 | 40 | 40 | 40 |  |  | 30 | 35 |
|  | Silica filler | R805 | 30 | 20 | 20 | 30 | 40 | 40 | 30 | 30 | 30 | 30 |  |  | 20 | 10 |
|  | Liquid epoxy resin | jER828 | 30 | 30 | 30 | 30 | 30 | 30 | 30 | 30 | 30 | 30 |  |  | 30 | 55 |
|  | Photoradical polymerizable resin | EB600 |  |  |  |  |  |  |  |  |  |  |  |  | 20 |  |
|  | Photoradical polymerization initiator | IRGACURE369 |  |  |  |  |  |  |  |  |  |  |  |  | 3 |  |
|  | Thermal cationic polymerization initiator | SI-60L | 4 | 4 | 4 | 4 | 4 | 4 | 4 | 4 | 4 |  |  |  |  | 4 |
|  | Photocationic polymerization initiator | ADEKA OPTOMER SP-171 |  |  |  |  |  |  |  |  |  | 4 |  |  |  |  |
|  | Silane coupling agent | KBM-403 | 1 | 1 | 1 | 1 | 1 | 1 | 1 | 1 | 1 | 1 |  |  | 1 | 1 |
| Adhesive layer | Phenoxy resin | YP-50 | 50 | 40 | 50 | 40 | 30 | 30 | 50 | 50 | 50 | 50 | 40 | 30 | 35 | 30 |
|  | Silica filler | R805 | 20 | 30 | 20 | 30 | 40 | 40 | 20 | 20 | 20 | 20 | 30 | 20 | 10 | 20 |
|  | Liquid epoxy resin | jER828 | 30 | 30 | 30 | 30 | 30 | 30 | 30 | 30 | 30 | 30 | 30 | 30 | 55 | 30 |
|  | Photoradical polymerizable resin | EB600 |  |  |  |  |  |  |  |  |  |  |  | 20 |  | 20 |
|  | Photoradical polymerization initiator | IRGACURE369 |  |  |  |  |  |  |  |  |  |  |  | 3 |  | 3 |
|  | Thermal cationic polymerization initiator | SI-60L | 4 | 4 | 4 | 4 | 4 | 4 | 4 | 4 | 4 |  | 4 |  | 4 |  |
|  | Photocationic polymerization initiator | ADEKA OPTOMER SP-171 |  |  |  |  |  |  |  |  |  | 4 |  |  |  |  |
|  | Silane coupling agent | KBM-403 | 1 | 1 | 1 | 1 | 1 | 1 | 1 | 1 | 1 | 1 | 1 | 1 | 1 | 1 |

TABLE 2

|  |  | Examples |  |  |  |  |  |  |  |
|---|---|---|---|---|---|---|---|---|---|
|  |  | 1 | 2 | 3 | 4 | 5 | 6 | 7 | 8 |
| Layer configuration corresponding drawing |  | 1 | 1 | 1 | 1 | 1 | 1 | 2 | 3 |
| Particle density | $10^3/mm^2$ | 30 | 30 | 30 | 30 | 30 | 30 | 30 | 30 |
| Particle diameter | μm | 3 | 3 | 3 | 3 | 3 | 3 | 3 | 3 |
| Particle area occupancy ratio | % | 21.2 | 21.2 | 21.2 | 21.2 | 21.2 | 21.2 | 21.2 | 21.2 |
| Percentage of independent electrically conductive particles | % | ≥95 | ≥95 | ≥95 | ≥95 | ≥95 | ≥95 | ≥95 | ≥95 |
| Thickness of adhesive layer | μm | 2 | 2 | 2 | 2 | 2 | 2 | 3 | 2 |
| Melt viscosity of adhesive layer | mPa·s | 10000 | 5000 | 5000 | 10000 | 20000 | 10000 | 10000 | 10000 |
| Thickness of intermediate layer | μm | 2 | 2 | 2 | 2 | 2 | 2 | 1 | 2 |
| Melt viscosity of intermediate layer | mPa·s | 5000 | 10000 | 5000 | 10000 | 20000 | 5000 | 5000 | 5000 |
| Thickness of electrically insulating base layer | μm | 14 | 14 | 14 | 14 | 14 | 14 | 14 | 14 |
| Melt viscosity of electrically insulating base layer | mPa·s | 500 | 500 | 500 | 500 | 500 | 2000 | 500 | 500 |
| Bonding process |  | Thermal | Thermal | Thermal | Thermal | Thermal | Thermal | Thermal | Thermal |
| Modulus of elasticity of film (100° C.) | Mpa | 2200 | 2200 | 2100 | 2200 | 2400 | 2500 | 2200 | 2200 |
| Glass transition temperature of film | ° C. | 165 | 165 | 163 | 165 | 167 | 168 | 165 | 165 |
| (a) Initial conduction resistance | Ω | 0.2 | 0.2 | 0.2 | 0.2 | 0.3 | 0.3 | 0.2 | 0.2 |
| (b) Conduction reliability | Ω | 2.4 | 2.3 | 2.2 | 2.5 | 2.8 | 3.2 | 2.3 | 2.9 |
| (C) Short circuit occurrence rate evaluation |  | OK | OK | OK | OK | OK | OK | OK | OK |
| (d) Temporary bonding properties evaluation |  | A | A | A | A | B | A | A | A |
| (e) Particle capturing properties evaluation | e-1 | A | A | A | A | A | A | A | A |
|  | e-2 | A | B | A | A | A | B | A | B |

|  |  | Example |  | Comparative Examples |  |  |  |
|---|---|---|---|---|---|---|---|
|  |  | 9 | 10 | 1 | 2 | 3 | 4 |
| Layer configuration corresponding drawing |  | 4 | 1 | 6 | 7 | 8 | 9 |
| Particle density | $10^3/mm^2$ | 30 | 30 | 70 | 30 | 30 | 30 |

TABLE 2-continued

| | | | | | | | |
|---|---|---|---|---|---|---|---|
| Particle diameter | μm | 3 | 3 | 3 | 3 | 3 | 3 |
| Particle area occupancy ratio | % | 21.2 | 21.2 | 39.6 | 21.2 | 21.2 | 21.2 |
| Percentage of independent electrically conductive particles | % | ≥95 | ≥95 | ≥70 | ≥95 | ≥95 | ≥95 |
| Thickness of adhesive layer | μm | 1 | 2 | 4 | 4 | 2 | 2 |
| Melt viscosity of adhesive layer | mPa·s | 10000 | 10000 | 10000 | 40000 | 1000 | 40000 |
| Thickness of intermediate layer | μm | 3 | 2 | | | 2 | 2 |
| Melt viscosity of intermediate layer | mPa·s | 5000 | 5000 | | | 40000 | 1000 |
| Thickness of electrically insulating base layer | μm | 14 | 14 | 14 | 14 | 14 | 14 |
| Melt viscosity of electrically insulating base layer | mPa·s | 500 | 500 | 500 | 500 | 500 | 500 |
| Bonding process | | Thermal | Thermal + UV | Thermal | Thermal | Thermal | Thermal |
| Modulus of elasticity of film (100° C.) | Mpa | 2200 | 2200 | 2100 | 1500 | 1800 | 1800 |
| Glass transition temperature of film | ° C. | 165 | 165 | 160 | 134 | 145 | 145 |
| (a) Initial conduction resistance | Ω | 0.2 | 0.2 | 0.9 | 0.6 | 0.3 | 0.3 |
| (b) Conduction reliability | Ω | 2.4 | 2.5 | 2.8 | 8.9 | 6.4 | 9.1 |
| (C) Short circuit occurrence rate evaluation | | OK | OK | NG | OK | OK | OK |
| (d) Temporary bonding properties evaluation | | A | A | B | D | A | D |
| (e) Particle capturing properties evaluation | e-1 | A | A | A | A | A | A |
| | e-2 | B | A | C | A | B | B |

As can be seen from Table 2, the anisotropic conductive films of Examples 1 to 10 exhibited good results for all the evaluation items. In particular, in the case where the melt viscosity of the layer retaining the electrically conductive particles was much higher than the melt viscosity of the electrically insulating base layer, the effect of improved electrically conductive particle capturing properties was produced. This effect is exhibited for the following reason. The melt viscosity of the intermediate layer, which is the layer retaining the electrically conductive particles, is higher than the melt viscosity of the electrically insulating base layer. As a result, displacement of the intermediate layer by the electrically insulating base layer is less likely to occur. On the contrary, if the melt viscosity of the electrically insulating base layer is higher than the melt viscosity of the intermediate layer, the intermediate layer can be easily displaced by the electrically insulating base layer. Thus, the intermediate layer can be flowed out even when its absolute melt viscosity is high.

In contrast, the anisotropic conductive film of Comparative Example 1 was evaluated as being "NG (poor)" for the short circuit occurrence rate because the electrically conductive particles were dispersed randomly in the electrically conductive particle-containing layer. In addition, because of the absence of an adhesive layer, the temporary bonding properties were lower than those in Examples.

In Comparative Example 2, the adhesive layer was photocured and, as a result, the temporary bonding properties were insufficient. In addition, the modulus of elasticity at 100° C. was below 1800 MPa, and this resulted in a significantly low conduction reliability. In Comparative Example 3, the presence of the adhesive layer resulted in improved temporary bonding properties as compared with Comparative Example 2. However, the modulus of elasticity at 100° C. was 1800 MPa, and this resulted in a significantly low conduction reliability. In Comparative Example 4, the intermediate layer was thermo-polymerizable, but the adhesive layer was photocured. As a result, the temporary bonding properties were insufficient. The modulus of elasticity at 100° C. was 1800 MPa, and this resulted in a significantly low conduction reliability.

INDUSTRIAL APPLICABILITY

The anisotropic conductive film of the present invention is useful in anisotropically conductively connecting an electronic component, e.g., an IC chip, to a circuit board. Wirings of electronic components are increasingly becoming narrower and smaller. The present invention is particularly useful in anisotropically conductive connection of a narrow and small electronic component.

REFERENCE SIGNS LIST 1, 71, 81, 91 Electrically insulating base layer
2, 82, 92 Intermediate layer
3, 73, 83, 93 Adhesive layer
4 Electrically conductive particle
5 Electrically insulating filler
10, 60, 70, 80, 90 Anisotropic conductive film
61 Electrically insulating resin layer
62 Electrically insulating binder
63 Electrically conductive particles
64 Electrically conductive particle-containing layer

The invention claimed is:

1. An anisotropic conductive film being thermo-polymerizable and comprising:
an electrically insulating base layer;
an adhesive layer;
an intermediate layer sandwiched between the electrically insulating base layer and the adhesive layer; and
electrically conductive particles retained by at least the adhesive layer or the intermediate layer,
wherein the intermediate layer and the adhesive layer each have a melt viscosity higher than a melt viscosity of the electrically insulating base layer,
the electrically conductive particles are independent of one another when the anisotropic conductive film is viewed in plan, and
a modulus of elasticity of the anisotropic conductive film as a whole, at 100° C., after thermal polymerization, is higher than 1800 MPa.

2. The anisotropic conductive film according to claim 1, wherein the modulus of elasticity of the anisotropic conductive film as a whole, at 100° C., after thermal polymerization is less than or equal to 2500 MPa.

3. The anisotropic conductive film according to claim 1, wherein a glass transition temperature of the anisotropic conductive film after thermal polymerization is higher than 145° C.

4. The anisotropic conductive film according to claim 3, wherein the glass transition temperature of the anisotropic conductive film after thermal polymerization is lower than or equal to 168° C.

5. The anisotropic conductive film according to claim 1, wherein the electrically conductive particles are embedded in the intermediate layer or the adhesive layer.

6. The anisotropic conductive film according to claim 1, wherein the electrically conductive particles are retained between the intermediate layer and the adhesive layer.

7. The anisotropic conductive film according to claim 1, wherein the electrically conductive particles are retained between the electrically insulating base layer and the intermediate layer.

8. The anisotropic conductive film according to claim 1, wherein the electrically conductive particles are arranged regularly in a lattice form.

9. The anisotropic conductive film according to claim 1, wherein the intermediate layer includes an electrically insulating filler.

10. A connection structure in which a first electronic component is anisotropically conductively connected to a second electronic component using the anisotropic conductive film according to claim 1.

11. A method of producing a connection structure of claim 10, the method comprising anisotropically conductively connecting a first electronic component to a second electronic component using the anisotropic conductive film according to claim 1.

* * * * *